(12) United States Patent
Van Bommel et al.

(10) Patent No.: US 8,462,325 B2
(45) Date of Patent: Jun. 11, 2013

(54) LIGHT DIRECTIONALITY SENSOR

(75) Inventors: Ties Van Bommel, Horst (NL); Eduard J. Meijer, Eindhoven (NL); Rifat A. M. Hikmet, Eindhoven (NL); Hendrik A. Van Sprang, Waalre (NL); Marcus A. Verschuuren, Tilburg (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 61 days.

(21) Appl. No.: 13/122,971

(22) PCT Filed: Oct. 6, 2009

(86) PCT No.: PCT/IB2009/054375
§ 371 (c)(1),
(2), (4) Date: Apr. 7, 2011

(87) PCT Pub. No.: WO2010/041198
PCT Pub. Date: Apr. 15, 2010

(65) Prior Publication Data
US 2011/0242526 A1 Oct. 6, 2011

(30) Foreign Application Priority Data

Oct. 10, 2008 (EP) .................................... 08166294

(51) Int. Cl.
*G01J 1/00* (2006.01)
(52) U.S. Cl.
USPC ........................................ 356/121; 365/141.2
(58) Field of Classification Search
USPC ............. 356/121, 141.1–141.5, 152.1–152.3, 356/154, 139.01–139.04; 385/129–132, 901, 385/147; 427/487, 162, 160
See application file for complete search history.

(56) References Cited

U.S. PATENT DOCUMENTS

| 5,428,215 A | 6/1995 | Dubois et al. |
| 6,521,882 B1 | 2/2003 | Sumiya et al. |
| 6,590,660 B2 | 7/2003 | Jung et al. |
| 6,770,865 B2 | 8/2004 | Wootton et al. |
| 2004/0104350 A1 | 6/2004 | Tsuchiya et al. |
| 2007/0139765 A1 | 6/2007 | Daniel et al. |
| 2007/0290284 A1 | 12/2007 | Shaffer |

FOREIGN PATENT DOCUMENTS

| EP | 0712009 A1 | 5/1996 |
| JP | 01270607 A | 10/1989 |
| JP | 05256691 A | 10/1993 |
| JP | 08043200 A | 2/1996 |
| JP | 10142047 A | 5/1998 |
| JP | 2007086068 A | 4/2007 |
| WO | 8908823 A1 | 9/1989 |
| WO | 03099463 A2 | 12/2003 |

*Primary Examiner* — Gregory J. Toatley, Jr.
*Assistant Examiner* — Tri T Ton
(74) *Attorney, Agent, or Firm* — Mark L. Beloborodov

(57) ABSTRACT

The present invention relates to light sensors for measuring light characteristics. In particular, the present invention relates to a light directionality sensor that is capable of measuring light characteristics such as the light direction, light collimation, and light distribution. According to a first aspect of the present invention there is provided a light directionality sensor comprising a photo-sensor (2), comprising a plurality of photo-sensitive elements (3), and a plurality of light-absorbing light selecting structures (1) arranged on the photo-sensor so as to form an array of light-absorbing light selecting structures. In the array of light-absorbing light selecting structures, a succession of at least some of the light-absorbing light selecting structures has varying structural characteristics. The varying structural characteristics is achieved by each individual structure of the succession being formed such that it allows light within a different angle interval with respect to the array to be sensed. Further, according to a second aspect of the invention, there is provided a method for forming a light sensor according to the first aspect of the present invention.

13 Claims, 7 Drawing Sheets

A

B

C

D

E ular user or users. However, prior art light sensors are unable to measure all of the desired light characteristics, require a large installation space, are expensive, etc.
LIGHT DIRECTIONALITY SENSOR

FIELD OF THE INVENTION

The present invention relates to light sensors for measuring light characteristics. In particular, the present invention relates to a light directionality sensor that is capable of measuring the light direction, light collimation, and light distribution.

BACKGROUND OF THE INVENTION

At everyday locations, such as rooms in homes, shops, offices, conference centres, etc., that are illuminated by artificial light sources, it is generally desired to measure light characteristics, e.g., the light direction, the light collimation, and the light intensity distribution together with properties such as colour point and colour rendering index of the light, in order to be able to adapt the light settings at the location in order to, e.g., save energy or to adjust the light settings according to the needs of a particular user or users. However, prior art light sensors are unable to measure all of the desired light characteristics, require a large installation space, are expensive, etc. Further, in case a light sensor is to be integrated into a light module or fixture, it should preferably be compactly designed, inexpensive, and robust. Furthermore, a light sensor should preferably be designed such that it may be used in various applications, e.g., during ambient light conditions, in energy-efficient ambient intelligent lighting systems, etc.

In addition, a further drawback with prior art light sensors is that they generally require imaging optics, such as lenses, mirrors, beam splitters, prisms, etc., as well as image processing and/or analysis.

Furthermore, in the case of, for example, a web camera (webcam), determining the light directionality would generally require direct imaging of the source.

Hence, there is a need within the art for a compact, robust and inexpensive light sensor which can be used in various applications and enables to measure light characteristics such as the light direction, the light collimation, and the light intensity distribution.

US 2007/0139765 A1 (D1) discloses a sensor having optical elements disposed thereon and light collimating screens having three portions, each with a different oblique angle of collimation relative to a substrate.

A drawback with D1 is that only three predetermined directions of incident light can be measured, thereby achieving merely a rough estimate of the light directionality. Thus, the distribution of light cannot easily be determined using D1.

SUMMARY OF THE INVENTION

Thus, it is an object of the present invention to achieve a compact, robust and inexpensive light sensor which can be used in various applications and enables to measure light characteristics such as the light direction, the light collimation, and the light intensity distribution.

A further object of the present invention is to achieve a method for forming such a light sensor.

According to a first aspect of the present invention, there is provided a light directionality sensor comprising a photo-sensor comprising a plurality of photo-sensitive elements, of which each is for sensing a light intensity, and a plurality of light-absorbing light selecting structures arranged on the photo-sensor so as to form an array of light-absorbing light selecting structures. In the array of light-absorbing light selecting structures, at least one succession of at least some of the light-absorbing light selecting structures have varying structural characteristics. The varying structural characteristics is achieved by each individual structure of the succession being formed such that it allows light within a different angle interval with respect to the array to be sensed. Such a light sensor can be used to measure direction of light incident on the light sensor, the collimation of light incident on the light sensor, the intensity distribution of light incident on the light sensor, etc., as will be described in the following. Furthermore, such a light sensor is robust, requires no auxiliary imaging optics, can easily be integrated into a light module or fixture, and can be manufactured at a low cost. Thus, the light sensor according to the first aspect of the present invention, unlike prior art light sensors, discriminates between different angles of incident light and is thus capable of measuring the direction of light incident on the light sensor, the collimation of light incident on the light sensor, the intensity distribution of light incident on the light sensor, etc.

According to a second aspect of the present invention, there is provided a method for forming a light directionality sensor. The method comprises the step of applying a solvent comprising electromagnetic-radiation-blocking particles on a substrate so as to form a layer on the substrate, wherein the substrate comprises a photo-sensor comprising a plurality of photo-sensitive elements, each of which is for sensing a light intensity. The method further comprises the step of forming the thus formed layer into an array of light selecting solid structures on the substrate, so that in the array of light-absorbing light selecting structures, at least one succession of at least some of the light-absorbing light selecting structures has varying structural characteristics. The varying structural characteristics is achieved by forming each individual structure of the succession such that it allows light within a different angle interval with respect to the array to be sensed. By such a method there is achieved a method for manufacturing a light directionality sensor according to the first aspect of the invention, which method has a relative low cost and can be readily applied on an industrial level for large-scale production.

According to a third aspect of the invention, there is provided an array of light directionality sensors according to the first aspect of the invention, wherein the light directionality sensors in the array are arranged so that at least some of the light directionality sensors are oriented differently with respect to each other. Such an arrangement enables, e.g., to achieve a higher sensitivity.

According to an embodiment of the present invention, the structural characteristics is one in a group consisting of the spacing between light-absorbing light selecting structures, the height of a light-absorbing light selecting structure, and the geometrical shape of a light-absorbing light selecting structure. Such structural characteristics are easy to realize and/or modify in construction of the light sensor.

According to another embodiment of the invention, the light sensor further comprises an electromagnetic-radiation-blocking structure. Such an electromagnetic-radiation-blocking structure provides the advantage, when suitably arranged on the light sensor, that light incident on the light sensor from certain directions can be blocked, thereby separating light from different directions as desired.

According to yet another embodiment of the invention, the light sensor further comprises at least one colour filter for filtering light by a wavelength range.

According to yet another embodiment of the invention, the light sensor further comprises a polarizing filter for filtering light of a certain polarization. Such a filter enables to gain information about the polarization of incident light as well. Thereby, according to this embodiment of the invention, it is possible to discriminate between light having different polarizations.

According to yet another embodiment of the invention, the step of forming an array of light selecting structures on the substrate is carried out using a microfabrication process, wherein the microfabrication process is a moulding process, an embossing process, or a lithographic process. Such processes are well known in the trade and machines for such purposes having good functionality are commercially available. Thereby, start-up costs can be minimized.

According to yet another embodiment of the invention, the method further comprises etching the array of light selecting solid structures. By etching the array of light selecting solid structures, excess material present between the light selecting structures can be removed, thereby increasing the sensitivity of the light sensor, because any excess material obstructing the substrate (the photo-sensor) prevents light from striking the photo-sensitive elements comprised in the photo-sensor.

According to yet another embodiment of the invention, the method further comprises etching the array of light selecting solid structures using one or more of reactive ion etching and ion beam etching. Such techniques allow for selective etching of any excess material present between the light selecting solid structures.

According to yet another embodiment of the invention, the method further comprises applying radiolucent material to the array of light selecting solid structures. Such a construction make, e.g., the thus formed sensor less susceptible to mechanical damage and at the same time still allow light to pass between the areas defined by the light selecting structures.

According to yet another embodiment, it is also possible to first fabricate radiolucent structures from radiolucent material by, e.g., using an imprinting process, followed by applying the light absorbing material in between the radiolucent structures.

According to yet another embodiment of the invention, the method further comprises coating the light selecting solid structures with light-absorbing material. This has the advantage that light that strikes any of the light selecting solid structures is less susceptible to be reflected against, e.g., the photo-sensor comprised in the substrate, which would pose the risk of generating incorrect signals in the photo-sensitive elements on the photo-sensor.

It should be understood that the exemplary embodiments of the present invention as shown in the figures are for illustrative purposes only. Further embodiments of the present invention will be made apparent when the figures are considered in conjunction with the following detailed description and the appended claims.

Furthermore, it is to be understood that the reference signs provided in the drawings are for the purpose of facilitating quicker understanding of the claims, and thus, they should not be construed as limiting the scope of the invention in any way.

DETAILED DESCRIPTION OF THE EMBODIMENTS

Preferred embodiments of the present invention will now be described for the purpose of exemplification with reference to the accompanying drawings, wherein like numerals indicate the same elements throughout the views. It should be understood that the present invention encompasses other exemplary embodiments that comprise combinations of features described in the following. Additionally, other exemplary embodiments of the present invention are defined in the appended claims.

Figure 1:
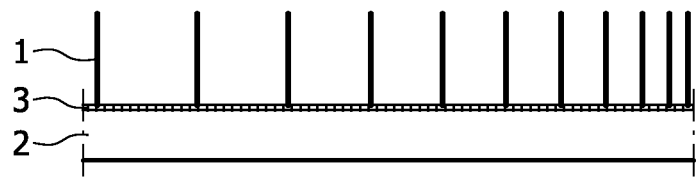
FIG. 1 is a schematic view of an embodiment according to the invention.

FIG. 1 is a schematic view which shows a light directionality sensor according to one exemplary embodiment of the present invention, wherein at least some of the light-absorbing light selecting structures 1 have different spacings therebetween, or pitch, as illustrated in FIG. 1. The light-absorbing light selecting structures are arranged on a photo-sensor 2 comprising a plurality of photo-sensitive elements 3 or pixels. It is to be understood that the light selecting structures 1 are made of a light-absorbing material, or are made of some material which has been coated with light-absorbing material, etc., or have been made light-absorbing by any other technique conceivable for a person skilled in the art.

Figure 2:
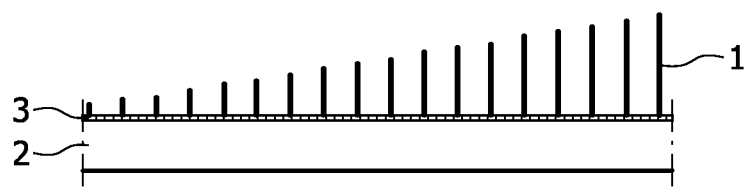
FIG. 2 is a schematic view of an embodiment according to the invention.
Figure 3A:
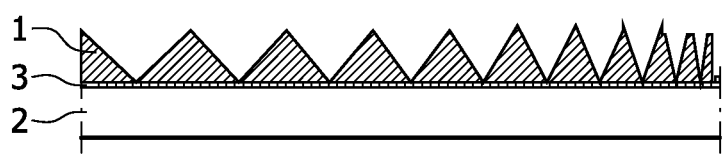
FIG. 3A is a schematic view of an embodiment according to the invention.
Figure 3B:
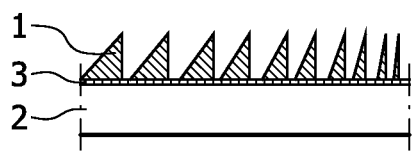
FIG. 3B is a schematic view of an embodiment according to the invention.
Figure 3B:
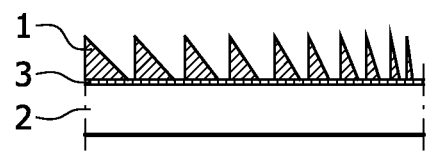

According to another exemplary embodiment of the present invention, at least some of the light-absorbing light selecting structures 1 on the photo-sensor 2 have different heights, as illustrated in FIG. 2. Furthermore, according to another exemplary embodiment of the present invention, at least some of the light-absorbing light selecting structures 1 have different geometric shapes, as illustrated in FIGS. 3A and 3B.

It is to be understood that, even if the accompanying drawings show examples of embodiments of the present invention in which at least some of the light-absorbing light selecting structures 1 either have different pitch, different height, or different geometrical shape, it is meant that the first aspect of the present invention encompasses any combination of different pitch, different height, and different geometrical shape. For example, in an exemplary embodiment of the present invention, at least some of the light-absorbing light selecting structures may have different pitch and different height, or different height and different shape, or different pitch, different height, and different shape, etc.

Figure 4:
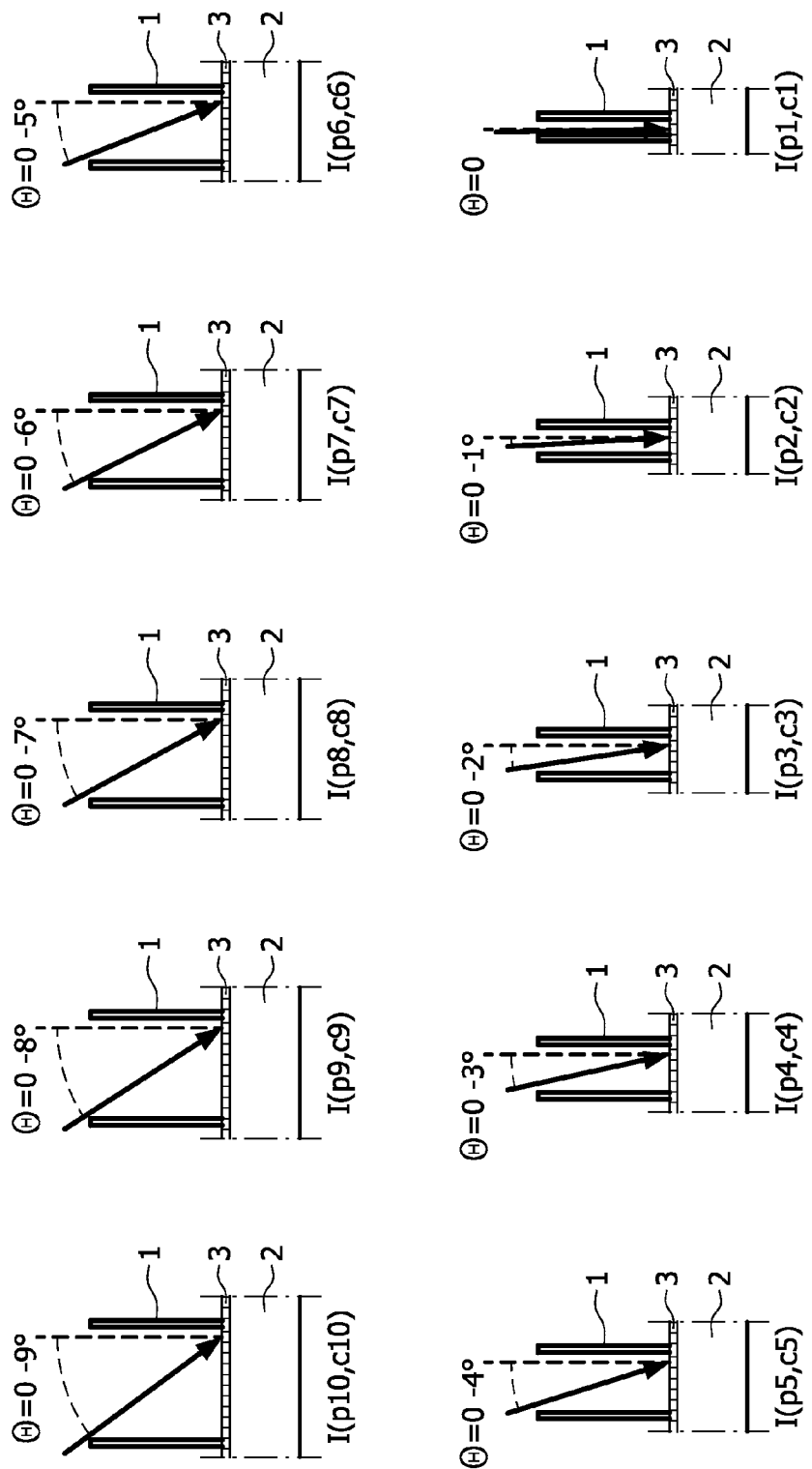
FIG. 4 is a schematic view of an embodiment according to the invention illustrating the working principle of the embodiment according to the invention shown in FIG. 1.

With reference to FIG. 4, the working principle of the exemplary embodiment of the present invention shown in FIG. 1 will now be described. The light directionality sensor according to an embodiment of the present invention shown in FIG. 4 comprises light selecting structures 1, wherein the spacing between the light selecting structures 1 (the pitch) is varying. As shown in FIG. 4, the light selecting structures 1 define a number of areas through which incident light may pass and strike the photo-sensitive elements 3 or pixels of the photo-sensor 2. From the bottom right and to the left, and from the upper right to the left, light selecting structures c1-c10 are shown which each comprises 1, 2, 3, 4, 5, 6, 7, 8, 9, and 10 photo-sensitive elements 3 or pixels, respectively. However, it is to be understood that each light selecting structure on the sensor may comprise any number of photo-sensitive elements. For each light selecting structure 1, the number of pixels is counted from the left side of the light selecting structure. For example, light selecting structure c2 has a pixel 1 at the left side of c2 and a pixel 2 at the right side of c2 (at which the incident light according to FIG. 4 strikes).

In the example shown in FIG. 4, it is assumed, for the purpose of explaining the principle of the invention, that light is coming from the left side of the figure. Another example, in which light is coming both from the left side and from the right side, will be discussed later.

According to the exemplary embodiment of the invention illustrated in FIG. 4, the intensity of light having an angle $\theta=0°$, $L(0°)$, incident on the light directionality sensor with respect to the light selecting structure is sensed by the single photo-sensitive pixel p1 of the light selecting structure c1 (referenced by $\theta=0°$). Further, the intensity of light having an angle between $\theta=0°$ and $\theta=1°$ is sensed by the photo-sensitive pixel p2 of the light selecting structure c2 (referenced by $\theta=0$-$1°$). Now, by subtracting the intensity of light sensed by pixel p1 of light selecting structure c1, I(p1,c1), from the intensity of light sensed at pixel p2 of light selecting structure c2, I(p2,c2), a signal that represents the intensity of light having an angle of $1°$, $L(1°)$, can be determined. Thereafter, as illustrated in table 1, signals that represents the intensity of light having varying angles ($L(2°)$, $L(3°)$, $L(4°)$, and so on) may be determined in an iterative manner from information on sensed light intensity obtained from the pixels comprised in further light selecting structures c3, c4, c5, and so on.

| Possibility | Calculated/sensed light intensity |
|---|---|
| no light | $I(p1, c1) = 0$ |
| $L(0°)$ | $I(p1, c1)$ |
| $L(1°)$ | $I(p2, c2) - L(0°)$ |
| $L(2°)$ | $I(p3, c3) - L(1°) - L(0°)$ |
| $L(3°)$ | $I(p4, c4) - L(2°) - L(1°) - L(0°)$ |
| $L(4°)$ | $I(p5, c5) - L(3°) - L(2°) - L(1°) - L(0°)$ |
| ... | ... |

Table 1: Working principle of how to determine the direction of light incident on a light directionality sensor according to an example of the present invention. L is a signal representative of the intensity of light having a certain angle of incidence, and I(pi,cj) is the intensity sensed at pixel pi at light selecting structure cj.

In this way, signals representing incident light having a plurality of angles of incidence can easily be determined using a single device according to the first aspect of the present invention. According to an embodiment of the invention, signals generated in the photo-sensor are transmitted to a processing unit (not shown), such as a CPU in a computer, for, e.g., generating an angular distribution of the incident light, for output to output means, for passing to a calculation unit, etc.

According to the exemplary embodiment of the invention illustrated in FIG. 4, the light selecting structures c1-c10 each measures light having an angle of incidence between $0°$ and $1°$, $2°$, $3°$, $4°$, $5°$, $6°$, $7°$, $8°$, and $9°$, respectively. It should be appreciated that it is also possible to modify the light selecting structures so as to allow coarser or finer measurements, e.g., to measure in coarser angle intervals, such as between $0°$ and $5°$, between $0°$ and $10°$, etc., by increasing/decreasing the height of the light selecting structures above the photo-sensor and/or increasing/decreasing the spacing between the light selecting structures. In this way, the desired angle interval for measurements can conveniently be realized.

According to another exemplary embodiment of the present invention, at least some of the light-absorbing light selecting structures 1 have different heights above the photo-sensor 2, as illustrated in FIG. 2. The working principle of the embodiment according to the present invention illustrated in FIG. 2 is completely analogous to the working principle of the embodiment of the present invention illustrated in FIG. 4, that has already been described above. Duplicate descriptions are omitted.

Figure 5:
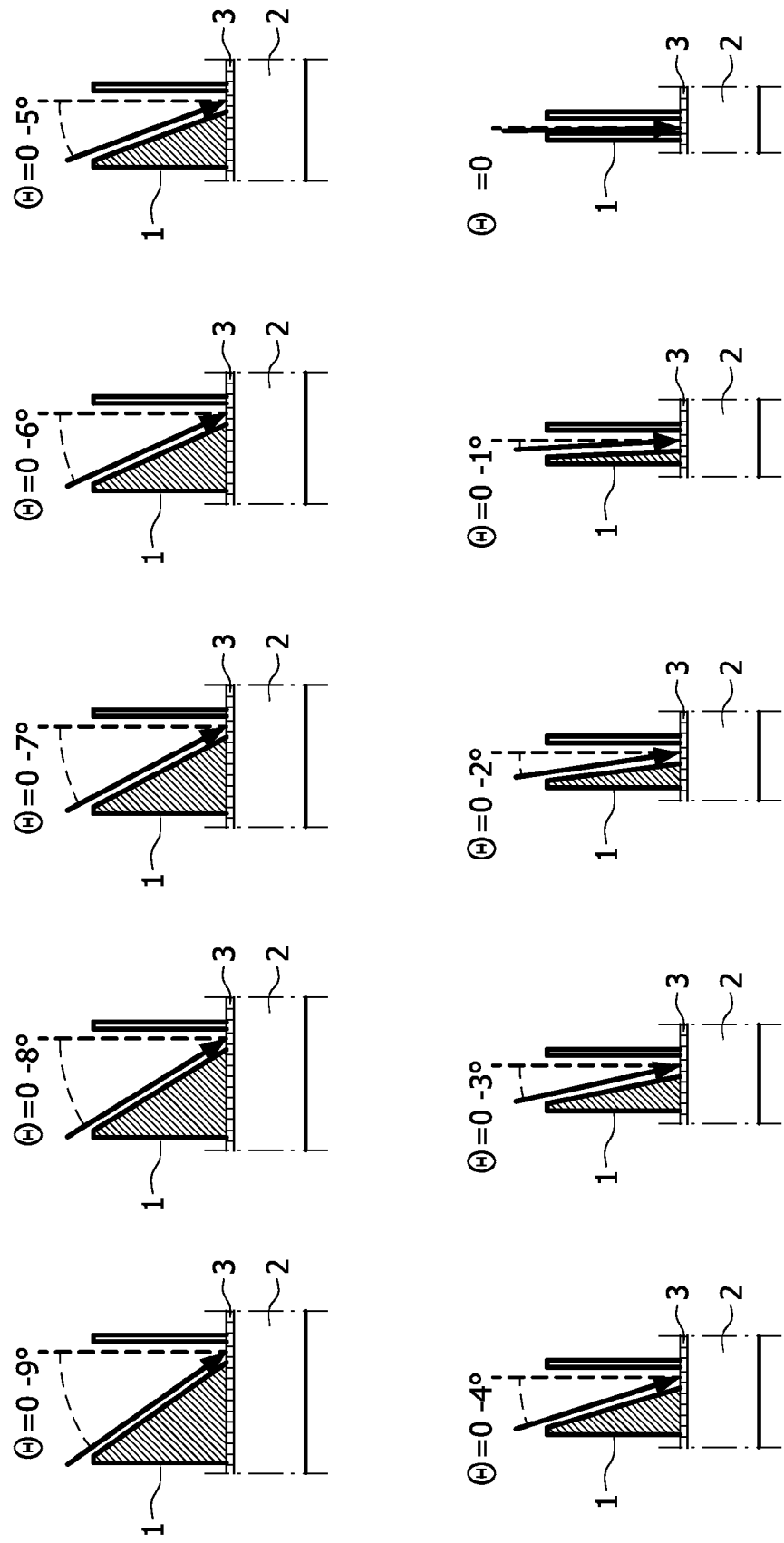
FIG. 5 is a schematic view of an embodiment according to the invention illustrating the working principle of the embodiments according to the invention shown in FIGS. 3A and 3B.

According to another exemplary embodiment of the present invention, at least some of the light-absorbing light selecting structures 1 have different geometrical shapes, as illustrated in FIGS. 3A and 3B. FIG. 3A shows symmetrical light selecting structures 1 having different shapes, whereas FIG. 3B shows two examples of asymmetrical light selecting structures 1 having different shapes. The working principle of the embodiment of the invention illustrated in FIGS. 3A and 3B is illustrated in FIG. 5. It is completely analogous to the working principle of the embodiment of the invention illustrated in FIG. 4, that has already been described above. Duplicate descriptions are omitted.

Figure 6:
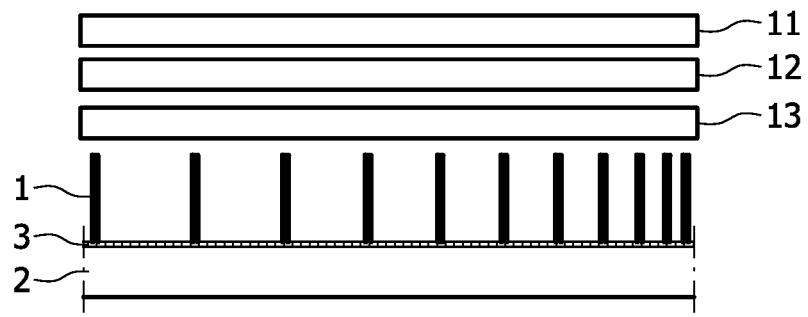
FIG. 6 is a schematic view of embodiments according to the invention.

FIG. 6 illustrates further embodiments of the invention, wherein the light directionality sensor further comprises a colour filter 11, a colour temperature filter 12, or a polarizing filter 13 for filtering light by a wavelength range (colour range), for filtering light by a colour temperature range, and for filtering light of a certain polarization, respectively. According to further embodiments of the invention, the light directionality sensor further comprises any combination of such filters. For instance, FIG. 6 illustrates the embodiment of the invention wherein the light directionality sensor further comprises a colour filter or array of colour filters 11, a colour temperature filter 12, and a polarizing filter 13. It is to be understood that the arrangement of the filters 11, 12, and 13 in FIG. 6 is exemplary. The filters 11, 12, and 13 can as well be arranged side by side on the sensor, etc. Furthermore, according to yet other embodiments of the invention, any of the filters described above or any combination of such filters is combined with the features of any of the embodiments illustrated in FIGS. 1, 2, 3A, and 3B and described above. It is further to be understood that the colour temperature filter 12 may comprise a plurality of colour filters for determining the colour point from which the colour temperature may be calculated.

Figure 7:
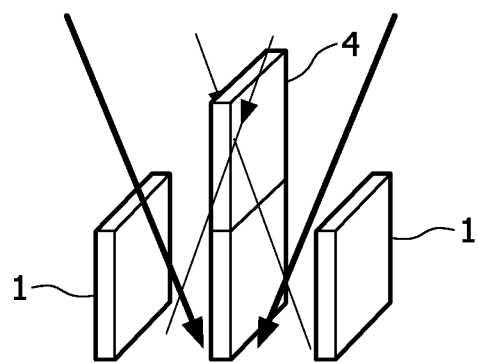
FIG. 7 is a schematic view of an embodiment according to the invention.

According to another embodiment of the invention, the light directionality sensor of the invention further comprises an electromagnetic-radiation-blocking structure 4. Such a structure 4 would, e.g., allow to separate light incident from different sides of the structure 4, as illustrated in FIG. 7. Note that in FIG. 7 the photo-sensor is not shown. However, it is to be understood that this is not to be construed as in any way limiting the present embodiment of the invention. Thus, FIG. 7 should be construed as if a photo-sensor was present.

It is to be understood that the exemplary embodiment of the invention illustrated in FIG. 7 could be extended to other geometries. For example, it could be extended to a circular geometry that would allow measuring azimuthal angles of light incident on the light directionality sensor. In such an example, the light-absorbing light selecting structures could be arranged successively along a polar direction, similar to the spokes of a wheel. Furthermore, in a further exemplary embodiment of the present invention, a center column made of an electromagnetic-radiation blocking material could be arranged as the "hub" of the "wheel". As well, it should be contemplated that other geometries are encompassed by the present invention. The working principle of an embodiment of the present invention illustrated in FIG. 7, when light is coming from more than one side, will be described in detail below with reference to FIGS. 8A-8C.

Furthermore, it is to be understood that for each of the embodiments of the invention illustrated in FIGS. 1, 2, 3A, 3B, 6, and 7, each type of light selecting structure 1 can be present on the photo-sensor 2 multiple times in order to increase the sensitivity of the light directionality sensor according to the first aspect of the invention. Thus, for each type of light selecting structure, having, e.g., different pitch, height, or geometrical shape, according to embodiments of the invention, multiple signals representing the intensity of incident light having a specific angle of incidence, or being within a specific angle interval, can be obtained, thereby enabling to increase the statistical significance of the so measured light characteristics, e.g. the light directionality.

Next, the working principle of the exemplary embodiment of the invention already described above in conjunction with FIG. 4, for an example where light is coming from two different sides, will be described in conjunction with FIGS. 8A-8C, that show light selecting structures similar to the ones in FIG. 4. In this example, slightly more complex calculations are necessary compared to the previous example when light is coming from a single side.

Figure 8A:
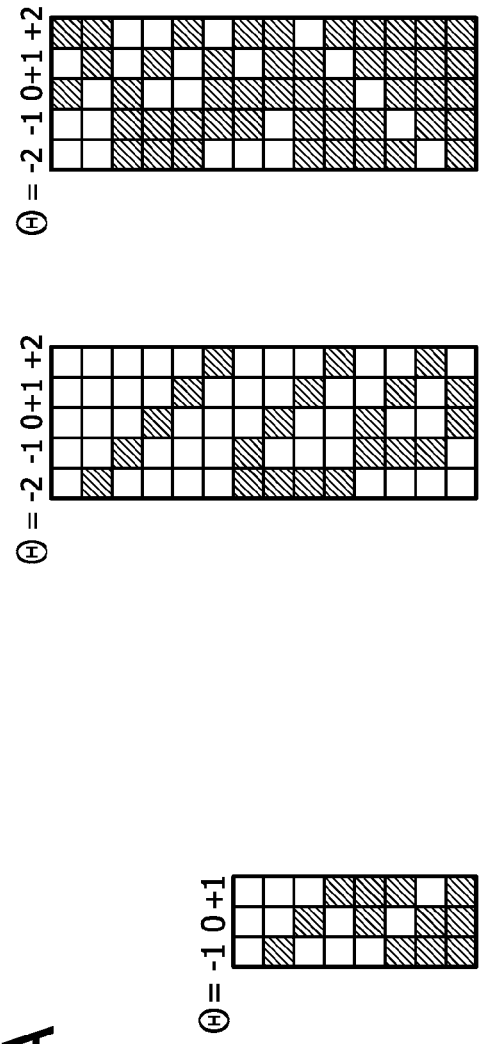
FIG. 8 is a schematic view of an embodiment according to the invention, further illustrating the working principle of the embodiment according to the invention shown in FIG. 1.

Referring first to FIG. 8A, it shows a light selecting structure c1 having a pixel p1. With respect to incident light on the photo-sensor, there exist two possibilities for the light selecting structure c1. There is either no light detected by pixel p1 of c1, wherein the intensity $I(p1,c1)=0$, or there is light detected by pixel p1 of c1, wherein the intensity $I(p1,c1)\neq 0$. Thus, the total intensity of light sensed by the photo-sensor pixel p1 is originating from light having an angle of incidence of 0° with respect to the light selecting structure c1. The matrix in FIG. 8A illustrates the two possibilities for the light selecting structure c1 with respect to sensed incident light. A white square indicates no light sensed by pixel p1 and a grey square indicates light sensed by pixel p1.

Figure 8B:
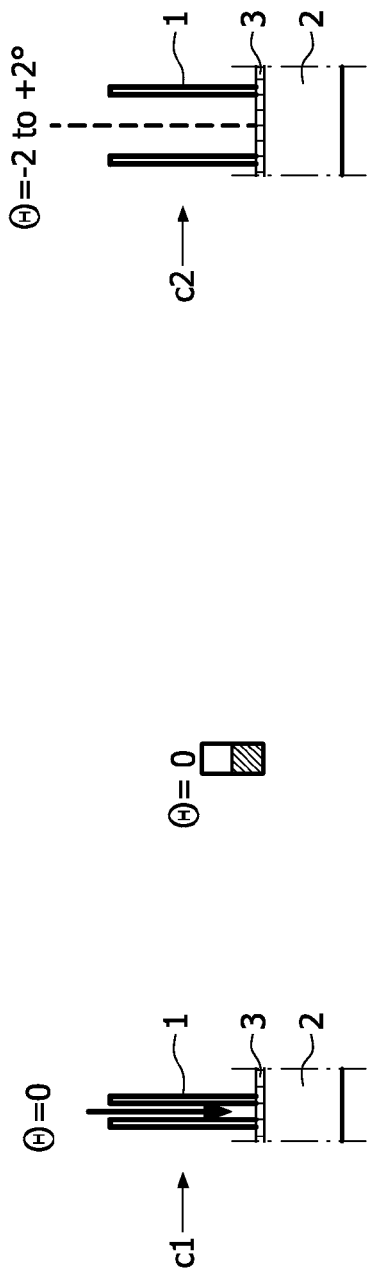

Next, FIG. 8B shows a light selecting structure c2 having two pixels p1 and p2, similarly to FIG. 4, for determining the intensity distribution of light having an angle of incidence between $\theta=-1°$ and $\theta=1°$. For the purposes of explaining the working principle of the exemplary embodiment of the invention, the pixels are counted from the left side of the light selecting structure. Thus, pixel p1 is the leftmost pixel and pixel p2 is the rightmost pixel in light selecting structure 2.

When determining the incident light intensity distribution for $\theta=-1°$ to $\theta=1°$, the sensed intensity $I(p1,c1)$ obtained from light selecting structure c1 according to the above is utilized as described in the following.

In the case shown in FIG. 8B, there are eight possibilities with respect to sensed incident light. Referring to FIGS. 8A and 8B, there can either be (i) no light detected, wherein $I(p1,c2)=I(p2,c2)=I(p1,c1)=0$, or there can be (ii) light having an angle of incidence of 0° with respect to the light selecting structure, wherein $I(p1,c1)=I(p1,c2)=I(p2,c2)\neq 0$, or there can be (iii) light having an angle of incidence of −1° with respect to the light selecting structure, wherein $I(p1,c1)=I(p1,c2)=0$ and $I(p2,c2)\neq 0$, or there can be (iv) light having an angle of incidence of 1°, wherein $I(p1,c1)=I(p2,c2)=0$ and $I(p1,c2)\neq 0$, or there can be (v) light having an angle of incidence between 0° and 1°, wherein $I(p1,c1)\neq 0$, $I(p1,c2)\neq 0$, and $I(p2,c2)=0$, or there can be (vi) light having an angle of incidence between −1° and 0°, wherein $I(p1,c1)\neq 0$, $I(p2,c2)\neq 0$, and $I(p1,c2)=0$, or there can be (vii) light having an angle of incidence between −1° and 1°, wherein $I(p1,c1)\neq 0$, $I(p1,c2)\neq 0$, and $I(p2,c2)\neq 0$, or, alternatively (viii), $I(p1,c1)=0$, $I(p2,c2)\neq 0$, and $I(p1,c2)\neq 0$. As already mentioned above, it is to be noted that $I(p1,c1)$ is known from measurements using light selecting structure c1 of FIG. 8A and is used for determining the incident light intensity distribution for $\theta=-1°$ to $\theta=1°$ as described below. The possibilities (i)-(viii) are further illustrated by the matrix in FIG. 8B. Just as for FIG. 8A, a grey square indicates light and a white square indicates no light.

The following calculations are required to determine the incident light intensity distribution for $\theta=-1°$ to $\theta=1°$.

For the cases (i)-(iv), no calculations need to be carried out. The angle of incidence of the light, or alternatively, that there is no light incident, is known directly from the measurements.

For the case (v), $I(p1,c1)>0$, which is known from c1. $I(p1,c1)$ equals a signal that represents the intensity of light having an angle of 0°, $L(0°)$, that is, $L(0°)=I(p1,c1)$. Furthermore, analogous to the above discussion in conjunction with FIG. 4, a signal that represents the intensity of light having an angle of 1°, $L(1°)$, can be determined as $L(1°)=I(p1,c2)-L(0°)=I(p1,c2)-I(p1,c1)$. In this manner, the intensity distribution of light having an angle of incidence between $\theta=0°$ and $\theta=1°$ can be determined.

For the case (vi), $L(0°)=I(p1,c1)>0$ is known from c1. Furthermore, analogous to the above discussion in conjunction with FIG. 4, a signal that represents the intensity of light having an angle of −1°, $L(-1°)$, can be determined as $L(-1°)=I(p2,c2)-L(0°)=I(p2,c2)-I(p1,c1)$. In this manner, the intensity distribution of light having an angle of incidence between $\theta=-1°$ and $\theta=0°$ can be determined.

For the case (vii), $L(0°)=I(p1,c1)>0$ is known from c1. Furthermore, analogous to the above discussion in conjunction with FIG. 4 and immediately above, a signal that represents the intensity of light having an angle of −1°, $L(-1°)$, can be determined as $L(-1°)=I(p2,c2)-L(0°)=I(p2,c2)-I(p1,c1)$, and a signal that represents the intensity of light having an angle of 1°, $L(1°)$, can be determined as $L(1°)=I(p1,c2)-L(0°)=I(p1,c2)-I(p1,c1)$. In this manner, the intensity distribution of light having an angle of incidence between $\theta=-1°$ and $\theta=1°$ can be determined for the case (vii).

For the case (viii), $L(0°)=I(p1,c1)=0$ is known from c1. Analogous to the discussion immediately above, a signal that represents the intensity of light having an angle of −1°, $L(-1°)$, can be determined as $L(-1°)=I(p2,c2)-L(0°)=I(p2,c2)$, and a signal that represents the intensity of light having an angle of 1°, $L(1°)$, can be determined as $L(1°)=I(p1,c2)-L(0°)=I(p1,c2)$. In this manner, the intensity distribution of light having an angle of incidence between $\theta=-1°$ and $\theta=1°$ can be determined for the case (viii).

Figure 8C:
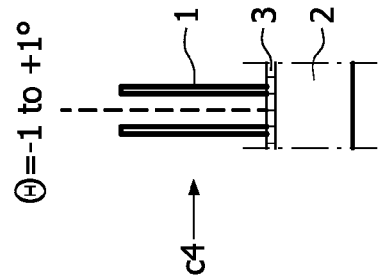

FIG. 8C shows a light selecting structure c4 having four pixels, similarly to FIG. 4, for determining the intensity distribution of light having an angle of incidence between $\theta=-2°$ and $\theta=2°$. In the case shown in FIG. 8C, there are twenty-eight possibilities with respect to sensed incident light, illustrated by the matrices in FIG. 8C. For brevity, the different possibilities will not be described here, but rather, it is sufficient to note that the possibilities, and the corresponding calculations, are completely analogous to those described in conjunction with FIG. 8B. Just as for FIGS. 8A and 8B, a grey square indicates light and a white square indicates no light. It is also to be noted that the calculations utilizes information already obtained from light selecting structure c2 shown in FIG. 8B.

Naturally, the manner in which the intensity distribution of light having an angle of incidence between, e.g., $\theta=-3°$ and $\theta=3°$, $\theta=-4°$ and $\theta=4°$, etc. is determined is completely analogous to the case above for $\theta=-2°$ to $\theta=2°$ and $\theta=-1°$ to $\theta=1°$ and will not be described here.

The working principle of some specific embodiments according to the present invention has been described above, but it is to be understood that completely analogous working principles apply to other exemplary embodiments according to the present invention encompassed by the appended claims, despite not necessarily being described herein. For instance, completely analogous working principles apply to the embodiments of the invention illustrated in FIGS. 2, 3A, 3B, 5, 6, 7, and to the embodiments of the invention illustrated in FIG. 7 extended to other geometries, as discussed above.

Figure 9:
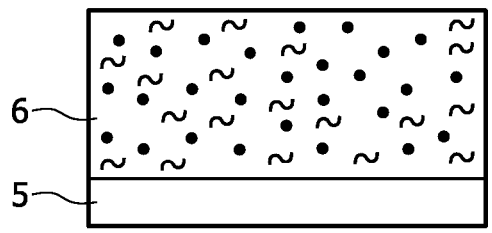
FIG. 9 is a schematic view of an embodiment according to the invention.
Figure 9:
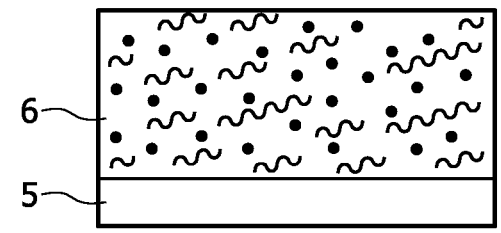
Figure 9:
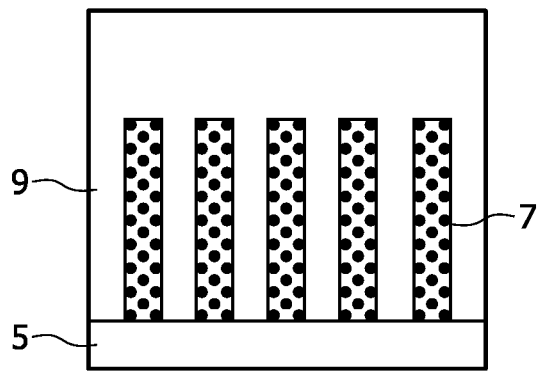
Figure 9:
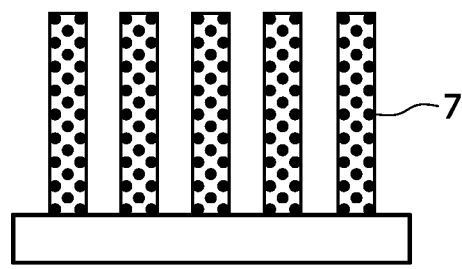
Figure 9:
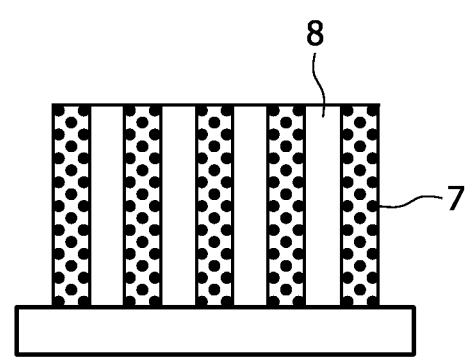

FIG. 9 illustrates an exemplary embodiment of a method for manufacturing a light directionality sensor according to the second aspect of the present invention. In order to produce light selecting structures, embossing, moulding, or a lithographic process may be utilized. Substrate Conformal Imprint Lithography (SCIL), developed by Philips Research, is particularly useful for producing micrometer and nanometer sized structures having high aspect ratios (1:10) in single or stacked layers with nanometer alignment. This technique is particularly suited for directly producing light selecting structures on a substrate, such as a photo-sensor, due to its ability to print features having up to nanometer size with a high aspect ratio and with a high accuracy. In addition, the technique is inexpensive and may be readily applied on an industrial scale of manufacturing. FIG. 9 illustrates an exemplary embodiment according to a method for manufacturing a light directionality sensor according to the second aspect of the present invention using a lithographic process. At step A, a layer of solvent 6 comprising electro-magnetic-radiation particles is applied to a substrate 5 by, e.g., spin coating or doctor blading. The substrate 5 may be, e.g., a photo-sensor. During step A, the solvent 6 evaporates, forming a gel, as illustrated in step B. Thereafter, in step C, the layer is embossed using a flexible rubber stamp 9 that is gently applied by a printer, such as a SCIL printer. Step C is advantageously carried out, according to an exemplary embodiment of the present invention, so as to prevent air inclusions, an example of which is described in WO 2003/099463 and EP 1 511 632.

According to the second aspect of the invention, the embossing of the layer is carried out such that an array of light selecting solid structures 7 are formed on the substrate, wherein a succession of at least some of the light-absorbing light selecting structures 7 has varying structural characteristics. The varying structural characteristics is achieved by forming each individual structure of the succession such that it allows light within a different angle interval with respect to the array to be sensed.

Next, in step D, the solvent 6 diffuses cross-linked material, that has been formed during the process, into the stamp 9, leaving an array of light selecting solid structures 7 on the substrate 5, after which the stamp 9 is removed in such a way as not to inflict damage on the thus formed solid structures 7.

At this stage, according to an exemplary embodiment of the present invention, if there is still some excess material present between the structures 7, the thus formed device may be etched to remove the excess material. In further exemplary embodiments of the present invention, such etching is carried out using reactive ion etching or ion beam etching.

Furthermore, according to another exemplary embodiment of the present invention, the space between the solid structures 7 formed according to the above description can be filled with a radiolucent material 8, such as a polymer, as illustrated in step E in FIG. 9. Such a construction would, e.g., make the thus formed device less susceptible to mechanical damage.

Moreover, according to a further exemplary embodiment of the invention, a reverse process to the one described above may be carried out to produce a light directionality sensor. That is, first producing solid structures according to the above description in conjunction with FIG. 9, wherein the solid structures are made of a radiolucent material, and subsequently filling the space between the solid structures of radiolucent material with an electromagnetic-radiation-blocking material.

Alternatively, according to a further exemplary embodiment of the invention, the structures thus formed may be coated with a light-absorbing material in a suitable way apparent for a person skilled in the arts. This has the advantage that light that may strike any of the structures is less susceptible to be reflected against, e.g., the photo-sensor comprised in the substrate, which would pose the risk of generating incorrect signals in the photo-sensitive elements on the photo-sensor.

Figure 10:
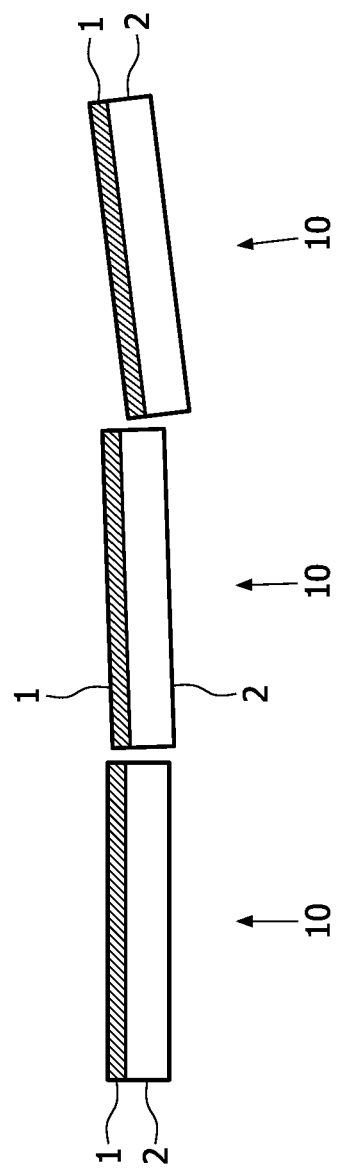
FIG. 10 is a schematic view of an embodiment according to the invention.

FIG. 10 illustrates an exemplary embodiment of the third aspect of the present invention. FIG. 10 shows an array of light directionality sensors 10 according to the first aspect of the present invention, wherein the light directionality sensors 10 are oriented differently with respect to each other. Despite the fact that FIG. 10 shows three light directionality sensors 10, it should not be construed as limiting the third aspect of the invention to three such light directionality sensors 10, but rather, any number of light directionality sensors could be included in accordance with different embodiments of the third aspect of the present invention.

Even though the present invention has been described with reference to specific exemplifying embodiments thereof, many different alterations, modifications and the like will become apparent for those skilled in the art. The described embodiments are therefore not intended to limit the scope of the present invention, as defined by the appended claims.

Furthermore, in the claims, the word "comprising" does not exclude other elements or steps, and the indefinite article "a" or "an" does not exclude plurality. Also, any reference signs in the claims should not be construed as limiting the scope of the present invention.

In conclusion, the present invention relates to light sensors for measuring light characteristics. In particular, the present invention relates to a light directionality sensor that is capable of measuring light characteristics such as the light direction, light collimation, and light distribution. According to a first aspect of the present invention there is provided a light directionality sensor comprising a photo-sensor 2, comprising a plurality of photo-sensitive elements 3, and a plurality of light-absorbing light selecting structures 1 arranged on the photo-sensor so as to form an array of light-absorbing light selecting structures. In the array of light-absorbing light selecting structures, a succession of at least some of the light-absorbing light selecting structures has varying structural characteristics. The varying structural characteristics is achieved by each individual structure of the succession being formed such that it allows light within a different angle interval with respect to the array to be sensed. Further, according to a second aspect of the invention, there is provided a method for forming a light sensor according to the first aspect of the present invention.

The invention claimed is:

1. A light directionality sensor, comprising:
 a photo-sensor comprising a plurality of photo-sensitive elements, each of which is for sensing a light intensity; and
 a plurality of light-absorbing light selecting structures arranged on said photo-sensor so as to form an array of light-absorbing light selecting structures, wherein a succession of at least some of the light-absorbing light selecting structures has varying structural characteristics by each individual structure of the succession being arranged such that it allows light within a different angle interval with respect to the array to be sensed, wherein the structural characteristics is selected from the group consisting of the spacing between light-absorbing light selecting structures, the height of a light-absorbing light selecting structure, and the geometrical shape of a light-absorbing light selecting structure.

2. The light directionality sensor according to claim 1, further comprising an electromagnetic-radiation-blocking structure.

3. The light directionality sensor according to claim 1, further comprising a colour filter for filtering light by a wavelength range.

4. The light directionality sensor according to claim 1, further comprising a colour temperature filter for filtering light by a colour temperature range.

5. The light directionality sensor according to claim 1, further comprising a polarizing filter for filtering light of a certain polarization.

6. A method for forming a light directionality sensor, the method comprising the steps of:
 applying a solvent comprising electromagnetic-radiation-blocking particles on a substrate so as to form a layer on the substrate, wherein the substrate comprises a photo-sensor comprising a plurality of photo-sensitive elements, each of which is for sensing a light intensity; and
 forming the layer into an array of light selecting solid structures on the substrate, wherein a succession of at least some of the light-absorbing light selecting structures is provided with varying structural characteristics by forming each individual structure of the succession such that it allows light within a different angle interval with respect to the array to be sensed, wherein the structural characteristics is selected from the group consisting of the spacing between light-absorbing light selecting structures, the height of a light-absorbing light selecting structure, and the geometrical shape of a light-absorbing light selecting structure.

7. The method according to claim 6, wherein the step of forming the layer into an array of light selecting structures on the substrate is carried out using a microfabrication process.

8. The method according to claim 7, wherein the microfabrication process is a moulding process, an embossing process, or a lithographic process.

9. The method according to claim 8, wherein the embossing process is carried out using a stamp made of a flexible material.

10. The method according to claim 6, further comprising the step of etching the array of light selecting solid structures.

11. The method according to claim 10, wherein the step of etching the array of light selecting solid structures comprises using one or more of reactive ion etching and ion beam etching.

12. The method according to claim 6, further comprising the step of applying radiolucent material to the array of light selecting solid structures.

13. An array of light directionality sensors according to claim 1, wherein the light directionality sensors in the array are arranged so that at least some of the light directionality sensors are oriented differently with respect to each other.

* * * * *